United States Patent [19]

Brehse

[11] 4,281,360

[45] Jul. 28, 1981

[54] HIGH-VOLTAGE CAPACITOR

[75] Inventor: Robert F. Brehse, Fort Wayne, Ind.

[73] Assignee: General Electric Company, Salem, Va.

[21] Appl. No.: 104,672

[22] Filed: Dec. 17, 1979

[51] Int. Cl.³ .............................................. H01G 1/035
[52] U.S. Cl. .................................... 361/303; 361/306; 361/311; 361/404
[58] Field of Search ............... 361/404, 405, 406, 301, 361/311, 303, 306, 310, 235

[56] References Cited

U.S. PATENT DOCUMENTS

| 793,647 | 7/1905 | Fessinden | 361/301 X |
| 1,831,882 | 11/1931 | Proctor | 361/303 |
| 3,123,765 | 3/1964 | Julie | 361/275 X |
| 3,239,720 | 3/1966 | Rayburn | 361/405 |

FOREIGN PATENT DOCUMENTS

| 1292861 | 6/1961 | France | 361/405 |
| 247859 | 1/1948 | Switzerland | 361/303 |

Primary Examiner—E. A. Goldberg
Attorney, Agent, or Firm—J. H. Beusse

[57] ABSTRACT

A high-voltage capacitor, particularly for use in a voltage divider, is made from a high-voltage lead cable and a metallic component surrounding the cable for some distance along the length thereof, the metallic component being fixedly secured to a printed circuit board. The cable center conductor serves as the first capacitor plate while the metallic component serves as the second plate. In another aspect, the high voltage capacitor described above is incorporated into a high-voltage divider assembly which includes a voltage divider resistor assembly and a low-voltage capacitor.

2 Claims, 7 Drawing Figures

HIGH-VOLTAGE CAPACITOR

BACKGROUND OF THE INVENTION

1. Field of the Invention

The present invention relates to a high-voltage capacitor, and more particularly, to such a capacitor for use with a voltage divider and to such a voltage divider assembly for use in conjunction with a high-voltage power supply so as to provide a predictable frequency response necessary to obtain the required voltage waveform output fidelity for such a power supply.

2. Description of the Prior Art

In order to produce a high-voltage power supply for providing a 600 Hz high-voltage output with a controlled waveform, it is necessary to provide a feedback loop capable of sensing the output voltage and comparing it with a reference voltage waveform.

One such high-voltage power supply incorporates a pulse-width modulated inverter whose output is a 600 Hz trapezoidal shaped voltage waveform at approximately 10 KV peak (20 KV peak to peak). A voltage divider is placed across the output of the inverter so as to provide at its tap a feedback voltage on the order of a few volts for comparison to a reference voltage. In order to minimize loading on the inverter output, it is necessary for the upper resistor (the high voltage end) of the divider to have a high value: for example, 100 Megohms. It is also necessary for the voltage divider to have a predictable frequency response from low frequencies of about 1 Hz to high frequencies greater than 100 KHz. Predictable frequency response is necessary in order to obtain the necessary output voltage waveform fidelity required of such a power supply and to have a stable control loop.

It is not possible for a simple resistive voltage divider to provide the required frequency response. This is the case because it is not possible to avoid some stray capacitances from the divider resistors to the surrounding world. Assuming that the divider is placed in some kind of enclosure, capacitances from the resistors to the enclosure of several picofarads are normal. These capacitances are distributed along the resistors to the enclosure as will be understood by those skilled in the art. If the upper resistor of the divider has a resistance of 100 Megohms, a stray capacitance of 2 picofarads from its midpoint to ground, at 600 Hz, will provide $X_c$ of 133 Megohms; it will therefore already be creating frequency response problems. Furthermore, stray capacitances across the resistor cause other frequency response problems.

One solution to these aforementioned problems is to place a capacitive voltage divider in parallel with the resistive divider with the capacitor values selected so that the capacitive divider takes over at a frequency below that where the stray capacitances start upsetting the resistive divider. Such an arrangement is shown in FIG. 1 wherein the divider is provided with a ratio of 1 volt out to 4,000 volts in with values as set forth hereinafter.

Another problem arises, however: that of finding a low-cost, discrete capacitor having a capacitance of a few picofarads at 10 KV.

Accordingly, it is an object of the present invention to provide such a high-voltage capacitor for use in a voltage divider arrangement across the output of a high-voltage, AC power supply.

It is a further object of the present invention to provide a high-voltage divider assembly incorporating such a high-voltage capacitor, the assembly for use across the output of a high-voltage, AC power supply.

SUMMARY OF THE INVENTION

In carrying out the objects of my invention, in one form, there is provided a high-voltage capacitor which includes a length of high-voltage insulated lead cable having a center conductor adapted for connection to a source of high voltage, the center conductor further serving as the first capacitor plate. A conductive envelope surrounds the cable for a predetermined distance along the length of the cable, and serves as the second capacitor plate, the conductive envelope being fixedly secured to a base member. In one form of the preferred embodiment, the conductive envelope is a metallic piece wrapped around the cable, and includes tabs for securing to the base member through apertures provided therethrough. In another form of the preferred embodiment, the conductive envelope includes a generally U-shaped member placed over the lead cable and a conductive plate on the under side of the base member, the base member having apertures therethrough for receiving tabs projecting from the U-shaped member so as to make electrical contact with the conductive plate while securing the U-shaped member to the base member.

In another form of my invention, a high-voltage divider assembly includes a voltage divider resistor assembly mechanically secured to a printed circuit board. The printed circuit board serves as a support member for a high-voltage capacitor formed of a length of high-voltage insulated lead cable having a center conductor, one end of which is adapted for connection to a high-voltage source, the other end being connected to the voltage divider resistor through the printed circuit. The center conductor serves as the first capacitor plate while a conductive envelope, serving as the second capacitor plate, surrounds the lead cable for a predetermined distance along the length thereof. The conductive envelope is connected to the voltage divider tap through the printed circuit and is mechanically secured to the printed circuit board. A low-voltage capacitor has a first terminal adapted for connection to ground and is mechanically secured to the printed circuit board and a second terminal thereof is connected to the voltage divider tap through the printed circuit.

DESCRIPTION OF THE PREFERRED EMBODIMENT

Figure 2:
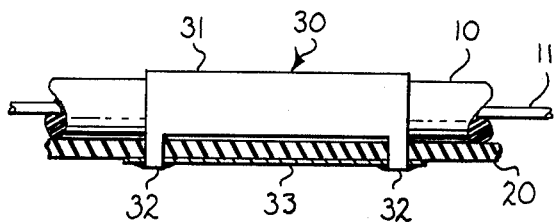
FIG. 2 is a side elevational view showing one form of the preferred embodiment of the high-voltage capacitor of the present invention.
Figure 3:
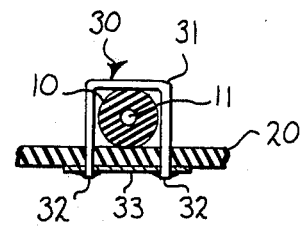
FIG. 3 is a front elevational view of the capacitor of FIG. 2.
Figure 4:
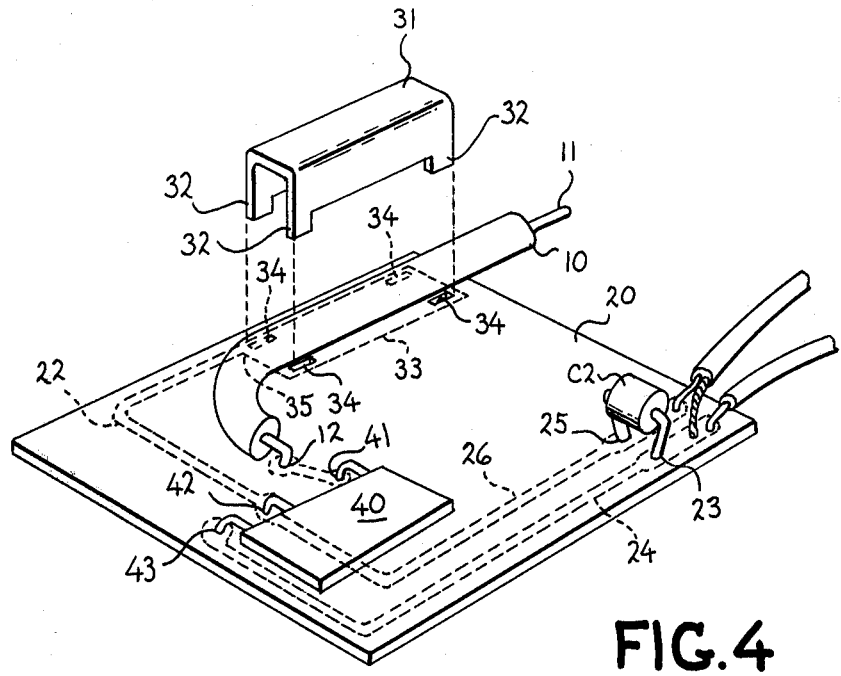
FIG. 4 is a perspective view, partially exploded, showing the capacitor of FIGS. 2 and 3 and the preferred embodiment of the high-voltage divider of the present invention.

In accordance with one aspect of the present invention and referring generally now to FIGS. 2, 3, and 4 there is shown one form of the preferred embodiment of my high-voltage capacitor. Included is a high-voltage insulated lead cable 10 having a center conductor 11 for connection to a source of high voltage, the center conductor further serving as the first capacitor plate. A base member serving as a mounting means is provided in the form of a flat insulating sheet, printed circuit board 20, and a conductive envelope 30 surrounds the cable for a predetermined distance along the length thereof, the conductive envelope serving as the second capacitor plate. As can be seen, the conductive envelope 30 is made up of two parts, the first part being an elongated, generally U-shaped metallic component 31 provided with tabs 32 extending from the sides of the U, the second part being a conductive plate 33 (phantom lines in FIG. 4) on the underside of the flat insulating sheet of the printed circuit board 20. A plurality of apertures 34 is provided through the printed circuit board 20 for receiving the respective tabs so as to make electrical contact between the generally U-shaped metallic component 31 and the conductive plate 33. The tabs and the conductive plate are then soldered together for electrical continuity and mechanical rigidity.

In actual practice, the conductive plate on the underside of the printed circuit board 20 is formed from the conductive material bonded to the insulating layer of the printed circuit board.

Figure 6:
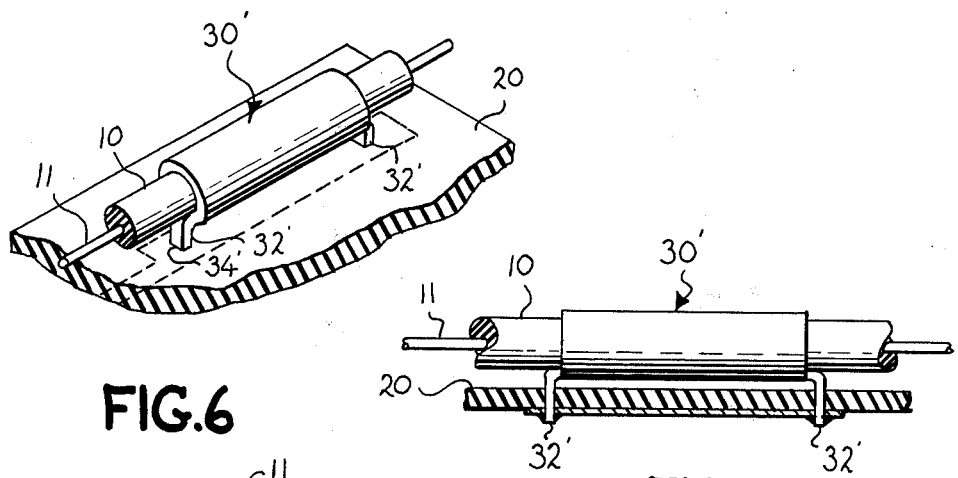
FIG. 6 is a perspective view of a second form of the preferred embodiment of the high-voltage capacitor of the present invention.
Figure 7:
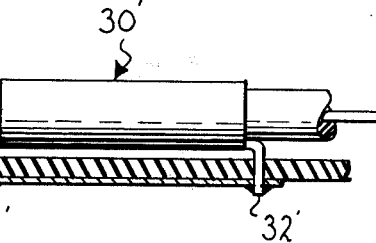
FIG. 7 is a side elevational view of the capacitor of FIG. 6.

A second form of the preferred embodiment of the high-voltage capacitor of the present invention is shown in FIGS. 6 and 7. As can be seen, the conductive envelope 30' is formed of a metallic sheet totally encircling the high-voltage insulated lead cable 10 for some distance. The conductive envelope in this form is provided with a pair of tabs 32' for insertion through a pair of holes 34' in the printed circuit board, the tabs then being soldered to the conductive material on the underside of the board for mechanically securing the assembly to the printed circuit board 20. With such an arrangement as shown in FIGS. 6 and 7, of course, there is no absolute need for a conductive plate to be formed from the circuit board material on the bottom side of the printed circuit board 20. However, a terminal may be provided thereunder of printed circuit board material for connecting the conductive envelope 30' to the remaining electrical circuitry on the circuit board.

Figure 1:
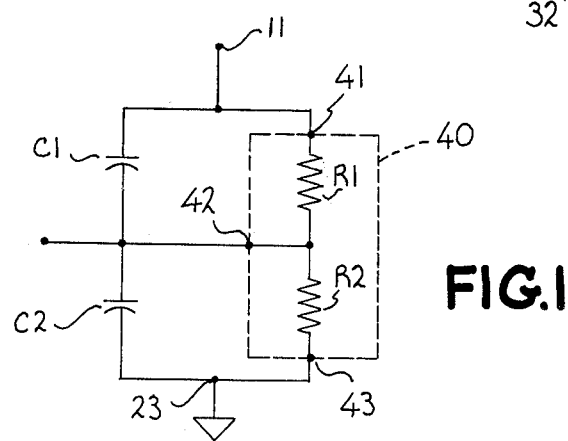
FIG. 1 shows by schematic representation the preferred embodiment of the circuit of a voltage divider having a predictable frequency response for use in the output of a high-voltage power supply.
Figure 5:
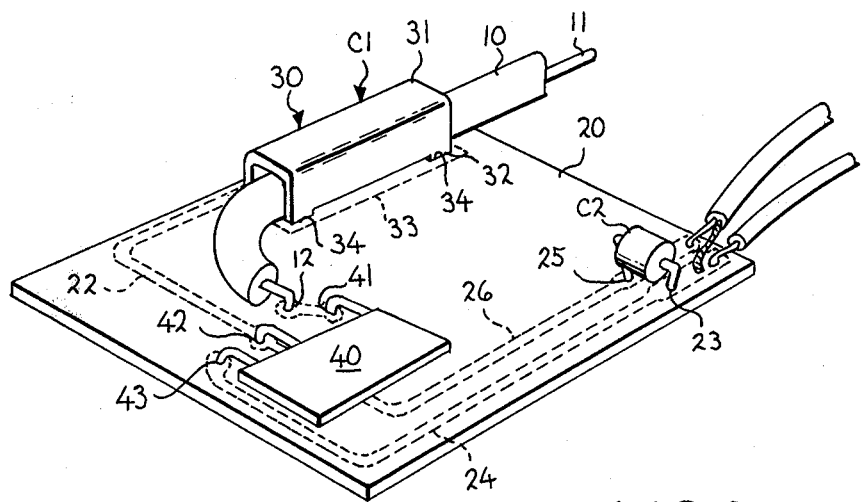
FIG. 5 shows the assembled view of the capacitor of FIGS. 2 and 3 and the high-voltage divider of FIG. 4.

In yet another aspect of the present invention, there is provided, as seen in FIGS. 4 and 5, a high-voltage divider assembly having the electrical circuit of FIG. 1. This voltage divider assembly includes printed circuit board 20, voltage divider resistor assembly 40 mechanically secured to the printed circuit board 20, high-voltage capacitor C1, and low-voltage capacitor C2. The voltage divider resistor assembly 40 is made up of resistors R1 and R2 (FIG. 1) having a ratio of 1 volt out to 4000 volts in.

The high-voltage capacitor C1 is formed in accordance with the previous teachings herein and may take the form of that shown in either of FIG. 2 or 6. High-voltage insulated lead cable 10 has a center conductor, one end 11 of which is adapted for connection to a high-voltage source, the other end 12 being connected to the voltage divider resistor assembly 40 through the printed circuit, as can be seen in FIGS. 4 and 5. Conductive envelope 30 serving as the second capacitor plate has its generally U-shaped metallic component 31 and the second part 33 thereof formed of a portion of the printed circuit board conductive layer being connected to the voltage divider tap 42 through a printed circuit board connection 22 making electrical connection at point 35.

Low-voltage capacitor C2 has one lead arranged for connection to ground at point 23, which point is connected through a printed circuit 24 to the low end 43 of the resistor divider assembly 40, while the second lead of capacitor C2 is connected at point 25 through the printed circuit 26 to the voltage divider tap 42.

Those skilled in the art will recognize that if resistor R2 is made to be adjustable, the resistor divider 40 then can be adjusted to match the divider ratio of the capacitive divider, which will vary due to capacitor tolerances. Such can be adjusted for a flat frequency response rather than for an exact divider ratio. Such an adjustment may also be used to change the divider compensation as needed to reduce droop of the output voltage waveform which may be attributed to a transformer which may be in circuit as well as to low frequency roll resulting from inverter operation.

What I have shown is a novel construction for a high-voltage capacitor capable of operating at 10 KV and anywhere from 1 Hz to 100 KHz. Such a high-voltage capacitor may be incorporated with other components to produce a novel high-voltage divider assembly. The high-voltage capacitor and the high-voltage divider assembly have been built and have operated satisfactorily with components having the following values and/or dimensions:

| Component | Value/Dimension |
|---|---|
| Capacitor C1 | 3.75 pF, 10KV |
| lead cable 10 | 0.19 in. OD, 20KV |
| conductive envelope 30 | 1.15 in. long |
| Capacitor C2 | .015 mF |
| Divider Resistor 40 | |
| resistor R1 | 100m Ohm |
| resistor R2 | 25K Ohm |

It should be apparent to those skilled in the art that the embodiment described heretofore is considered to be the presently preferred form of the invention; modifications and variations are possible in light of the above teachings. It is understood, therefore, in accordance with the Patent Statutes, that the invention may, within the scope of the appended claims, be practiced otherwise than as specifically described.

What is claimed is:

1. A high-voltage capacitor comprising:
   a length of high-voltage insulated lead cable having a center conductor adapted for connection to a source of high-voltage, the center conductor further serving as a first capacitor plate;
   a base member comprising a flat insulating sheet having a plurality of apertures therethrough; and
   a conductive envelope surrounding the cable for a predetermined distance along the length thereof, the conductive envelope serving as a second capacitor plate and being fixedly secured to the base member, said conductive envelope including two parts, the first part being an elongated generally U-shaped metallic component provided with tabs extending from the sides of the U, the second part being a conductive plate on the underside of the flat insulating sheet, the tabs being arranged to project through corresponding ones of said apertures so as to make electrical contact with the conductive plate, the tabs and the conductive plate being soldered together for electrical continuity and mechanical connection.

2. The capacitor of claim 1 wherein the flat insulating sheet is a printed circuit board, the conductive plate being formed from the conductive material bonded to the insulating layer of the printed circuit board.

* * * * *